United States Patent
Nomura et al.

(10) Patent No.: US 9,054,012 B2
(45) Date of Patent: Jun. 9, 2015

(54) RADIATION DETECTION APPARATUS AND METHOD OF MANUFACTURING THE SAME

(71) Applicant: CANON KABUSHIKI KAISHA, Tokyo (JP)

(72) Inventors: Keiichi Nomura, Honjo (JP); Kazumi Nagano, Honjo (JP); Satoshi Okada, Tokyo (JP); Yohei Ishida, Honjo (JP); Shoshiro Saruta, Kodama-gun (JP); Yoshito Sasaki, Kumagaya (JP); Tomoaki Ichimura, Kitamoto (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/927,844

(22) Filed: Jun. 26, 2013

(65) Prior Publication Data

US 2014/0008749 A1   Jan. 9, 2014

(30) Foreign Application Priority Data

Jul. 4, 2012 (JP) ................................ 2012-150751

(51) Int. Cl.
 *G01T 1/10* (2006.01)
 *H01L 27/146* (2006.01)
(52) U.S. Cl.
 CPC ..... *H01L 27/14685* (2013.01); *H01L 27/14618* (2013.01); *H01L 27/14663* (2013.01)
(58) Field of Classification Search
 CPC .................... G01T 1/2018; H01L 27/14663
 USPC .................................................... 250/361 R
 See application file for complete search history.

(56) References Cited

U.S. PATENT DOCUMENTS

| | | | |
|---|---|---|---|
| 5,179,284 A * | 1/1993 | Kingsley et al. | 250/370.11 |
| 7,256,404 B2 | 8/2007 | Inoue et al. | 250/370.11 |
| 7,265,371 B2 * | 9/2007 | Shoji et al. | 250/581 |
| 7,315,027 B2 | 1/2008 | Okada et al. | 250/370.11 |
| 7,391,029 B2 | 6/2008 | Takeda et al. | 250/370.11 |
| 7,514,686 B2 | 4/2009 | Ogawa et al. | 250/370.11 |
| 7,538,330 B2 | 5/2009 | Nomura et al. | 250/370.11 |
| 7,595,493 B2 | 9/2009 | Okada et al. | 250/370.11 |
| 7,714,294 B2 | 5/2010 | Sawada et al. | 250/370.11 |
| 7,723,693 B2 | 5/2010 | Okada et al. | 250/370.11 |
| 7,786,447 B2 | 8/2010 | Kondo et al. | 250/370.11 |
| 7,820,976 B2 | 10/2010 | Nakamura | 250/370.01 |
| 8,115,177 B2 | 2/2012 | Takeda et al. | 250/370.11 |
| 8,304,735 B2 | 11/2012 | Inoue et al. | 250/361 R |
| 2005/0196545 A1 * | 9/2005 | Ando | 427/446 |
| 2008/0210871 A1 | 9/2008 | Nakamura | 250/336.1 |
| 2011/0291018 A1 | 12/2011 | Nagano et al. | 250/369 |
| 2011/0309258 A1 | 12/2011 | Ishida et al. | 250/360 |
| 2013/0026377 A1 | 1/2013 | Ichimura et al. | 250/367 |

FOREIGN PATENT DOCUMENTS

| | | |
|---|---|---|
| JP | 2006-052986 | 2/2006 |
| JP | 2008-008899 | 1/2008 |
| JP | 2008-151768 | 7/2008 |

* cited by examiner

*Primary Examiner* — Kiho Kim
(74) *Attorney, Agent, or Firm* — Fitzpatrick, Cella, Harper & Scinto

(57) ABSTRACT

A method of manufacturing a radiation detection apparatus is provided. On a sensor substrate on which a pixel array is formed, a scintillator layer that covers the pixel array, a sealing layer that covers a side face of the scintillator layer, and a protection layer that covers an upper face of the scintillator layer and an upper face of the sealing layer are formed. The sensor substrate, the sealing layer, and the protection layer along a side of the pixel array are cut such that a cut surface of the sensor substrate, a cut surface of the sealing layer, and a cut surface of the protection layer are arranged on the same plane.

11 Claims, 4 Drawing Sheets

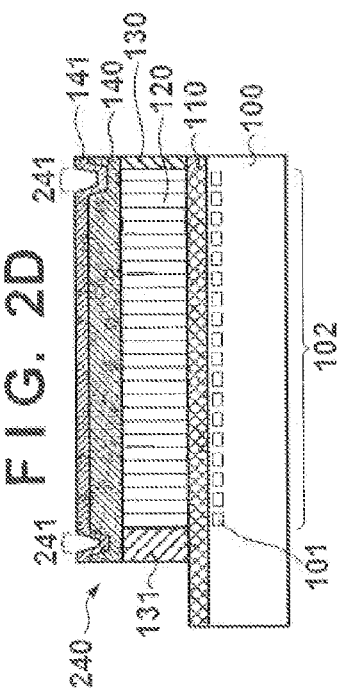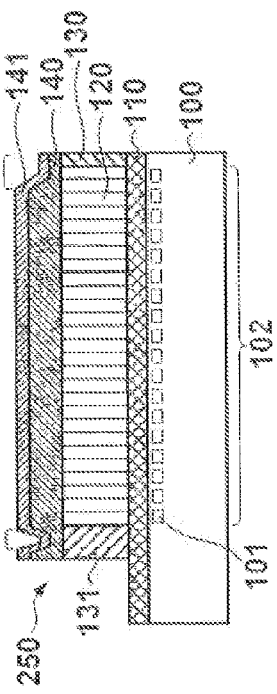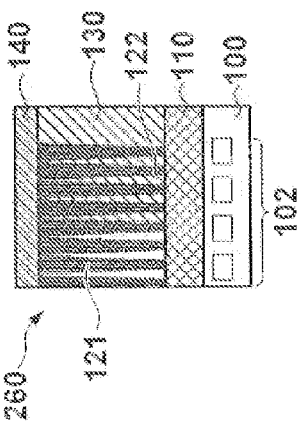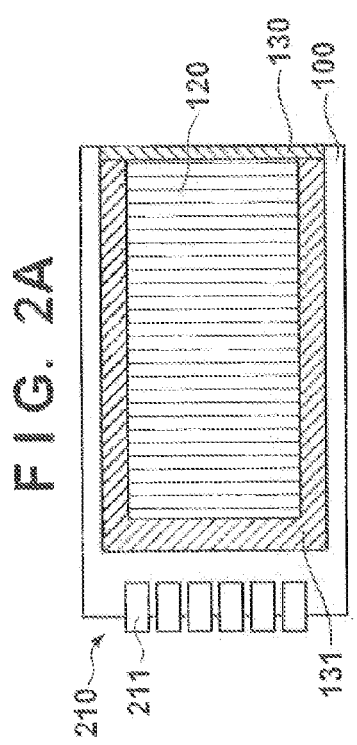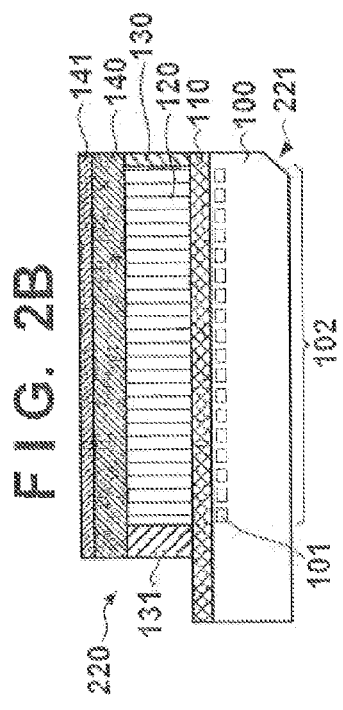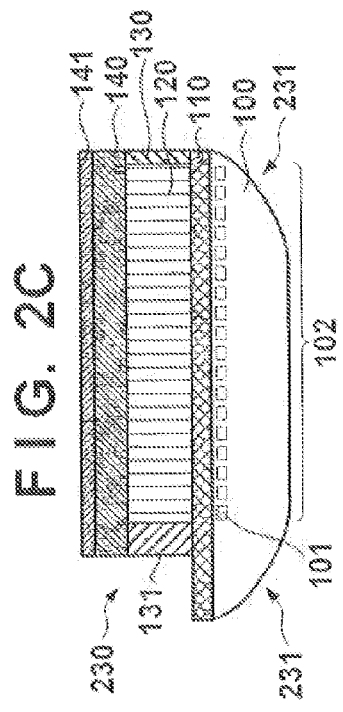

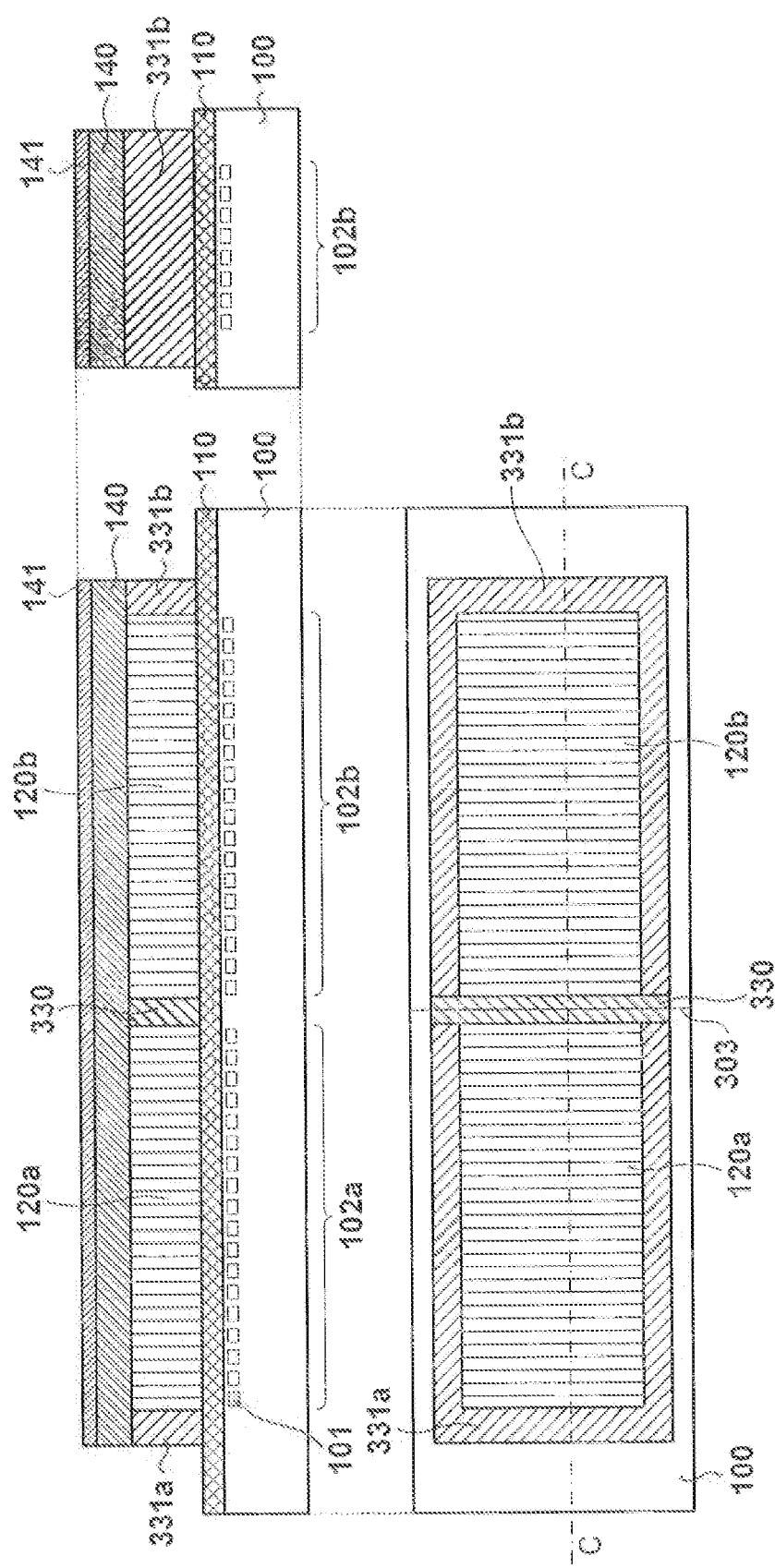

RADIATION DETECTION APPARATUS AND METHOD OF MANUFACTURING THE SAME

BACKGROUND OF THE INVENTION

1. Field of the Invention

The present invention relates to a radiation detection apparatus and a method of manufacturing a radiation detection apparatus.

2. Description of the Related Art

In order to realize a radiation detection apparatus that is capable of detecting radiation up to the vicinity of an edge of the radiation detection apparatus, Japanese Patent Laid-Open No. 2008-151768 proposes a technique of cutting a sensor substrate such that a side face of a phosphor layer and a side face of the sensor substrate are arranged on the same plane. Japanese Patent Laid-Open No. 2008-8899 proposes a technique of covering a radiation detector with a moisture-proof sheet-like film to improve moisture barrier properties of the radiation detector. Japanese Patent Laid-Open No. 2006-52986 proposes a technique of covering a side face of a phosphor layer with a frame member and covering an upper face thereof with a protection layer, thereby improving moisture barrier properties of the phosphor layer.

SUMMARY OF THE INVENTION

With the technique of Japanese Patent Laid-Open No. 2008-151768, moisture-proofing of the phosphor layer is not sufficient because the side face thereof is exposed to the air. With the technique of Japanese Patent Laid-Open No. 2008-8899, the moisture-proof film covers up to the side face of the sensor substrate on the side of a so-called narrow bezel, where the distance from a pixel array to the edge of the radiation detection apparatus is short, and therefore, the width of the bezel portion becomes wide for the moisture-proof film. Also, with the technique using the moisture-proof film, the moisture barrier properties degrade if the moisture-proof film is peeled off. With the technique of Japanese Patent Laid-Open No. 2006-52986, the moisture barrier properties of the phosphor layer improve, but narrowing of a bezel is not considered at all in this technique. Accordingly, an aspect of the present invention provides a technique for improving moisture barrier properties in a radiation detection apparatus having at least a part of its sides being a narrow bezel.

A first aspect provides a method of manufacturing a radiation detection apparatus, comprising: forming, on a sensor substrate on which a pixel array is formed, a scintillator layer that covers the pixel array, a sealing layer that covers a side face of the scintillator layer, and a protection layer that covers an upper face of the scintillator layer and an upper face of the sealing layer; and cutting the sensor substrate, the sealing layer, and the protection layer along a side of the pixel array such that a cut surface of the sensor substrate, a cut surface of the sealing layer, and a cut surface of the protection layer are arranged on the same plane.

A second aspect provides a radiation detection apparatus comprising: a sensor substrate having a pixel array; a scintillator layer that covers the pixel array; a sealing layer that covers a side face of the scintillator layer; and a protection layer that covers an upper face of the scintillator layer and an upper face of the sealing layer, wherein at least one side face of the sensor substrate is located on the same plane as a side face of the sealing layer and a side face of the protection layer.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 2A to 2F are diagrams illustrating variations of the embodiments in FIGS. 1A and 1B.

FIG. 3 is a diagram showing an exemplary method of manufacturing a radiation detection apparatus of some embodiments of the present invention.

DESCRIPTION OF THE EMBODIMENTS

Embodiments of the present invention will be described below with reference to the attached drawings. Through the different embodiments, similar elements are given the same reference signs, and redundant descriptions thereof will be omitted. Also, the embodiments can be modified or combined as appropriate. The embodiments of the present invention relate to a radiation detection apparatus including a pixel array in which a plurality of pixels for detecting light are arranged in an array, and a scintillator layer that converts incident radiation into light having a wavelength that can be detected by the pixels, and a method of manufacturing this radiation detection apparatus. The embodiments of the present invention relate in particular to a radiation detection apparatus in which the distance from a pixel array to an edge of the radiation detection apparatus is short on a part of the sides thereof, as in a radiation detection apparatus for mammography. Hereinafter, this side on which the distance to an edge of the radiation detection apparatus is short will be referred to as a narrow bezel side.

Figure 1A:
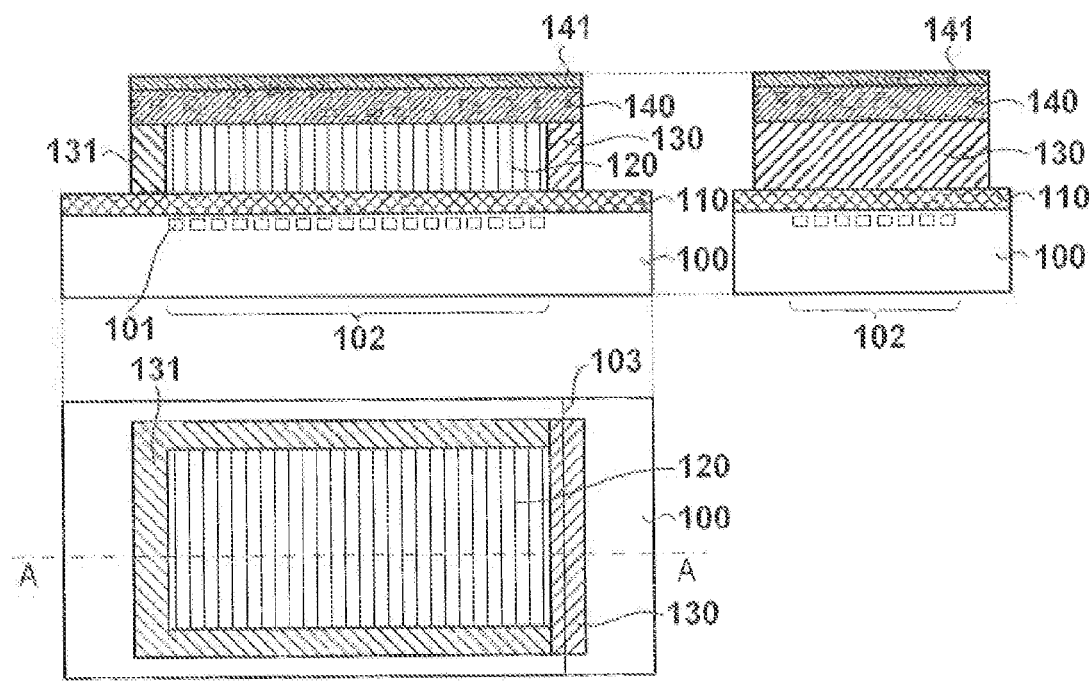
FIGS. 1A and 1B are diagrams showing an exemplary method of manufacturing a radiation detection apparatus of some embodiments of the present invention.

A method of manufacturing a radiation detection apparatus according to a first embodiment of the present invention will be described with reference to FIGS. 1A and 1B. First, a structure having a sensor substrate 100, on which a covering layer 110, a scintillator layer 120, sealing layers 130 and 131, and protection layers 140 and 141 are formed, is prepared as shown in FIG. 1A. In FIG. 1A, the lower diagram is a plan view of this structure, the upper right diagram is a right-side view of the structure, and the upper left diagram is a cross-sectional view of the structure, taken along line A-A. The plan view shows the sensor substrate 100, the scintillator layer 120, and the sealing layers 130 and 131, and omits the other components, for the purpose of explanation.

On the sensor substrate 100, a pixel array 102 having a plurality of pixels 101, which are arranged in an array, is formed. The pixels 101 convert light, which was converted from radiation by the scintillator layer 120, into charge. The pixel array 102 may be formed by any method, for example by a known method, and therefore a detailed description thereof will be omitted. For example, each pixel 101 may be constituted by a switching element that is made of amorphous silicon or polysilicon, and a photoelectric conversion element. Also, a CCD sensor or a CMOS sensor may be constituted by the pixel array 102. Also, the sensor substrate 100 may contain a sensor protection layer for protecting the pixel array 102 on the surface of the sensor substrate 100.

In the present embodiment, a scribe line 103 is formed along one side of the pixel array 102 outside the pixel array 102 of the sensor substrate 100. In a later-described process, the sensor substrate 100 is cut, using the scribe line 103 as a mark. The scribe line 103 is a groove formed at a position where the distance from the pixel array 102 is 2 mm or smaller, for example.

Subsequently, the covering layer 110 that is made of resin, such as polyimide (PI), is formed on the sensor substrate 100, using a technique such as slit-coating, spin-coating, or screen printing. With the covering layer 110, adhesion between the scintillator layer 120 and the sensor substrate 100 improves, resulting in increased yield of manufacturing. In another embodiment of the present invention, the covering layer 110 does not necessarily have to be formed, and the scintillator layer 120 may be formed directly on the sensor substrate 100.

Subsequently, the sealing layers 130 and 131 are formed on the covering layer 110 so as to cover the periphery of the pixel array 102. Either the sealing layer 130 (first portion) or the sealing layer 131 (second portion) may be formed first. In the present embodiment, the sealing layer 130 is formed on the side on which the scribe line 103 is formed, and the sealing layer 131 is formed on the other sides. The sealing layer 130 is formed on the scribe line 103. The sealing layers 130 and 131 may be made of epoxy resin, silicon resin, acrylic resin, acrylic-silicone resin, ultraviolet (UV)-cured resin, phenolic resin, or the like. Although the sealing layer 130 and the sealing layer 131 are made of different materials in the present embodiment, they may be made of the same material in another embodiment. The sealing layers 130 and 131 function as moisture-proof adhesive layers for the scintillator layer 120.

Since the sealing layer 130 is cut together with the sensor substrate 100 in a later-described process, it may be made of a material that is suitable for cutting. For example, the sealing layer 130 may be made of acrylic resin in the case where the sealing layer 130 is cut by a carbon dioxide laser ($CO_2$ laser) that is capable of cutting aluminum oxide (alumite), aluminum, Teflon, stainless steel, acrylic resin, glass, quartz glass, and the like. Among the above-listed materials, acrylic resin is suitable for cutting because the absorption wavelength of acrylic resin coincides with the emission wavelength (10.6 μm) of a laser beam machine. Also, if acrylic resin is cut, moisture barrier properties of acrylic resin improve due to heat generated by the carbon dioxide laser. Since the width of the sealing layer 130 is narrowed when it is cut, the sealing layer 130 may be made of black resin to improve its functions of blocking light from outside and of preventing the scattering of light from the scintillator layer 120. Black resin can be obtained by mixing acrylic resin to be the material of the sealing layer 130 with carbon black or the like, for example.

The sealing layer 131 is not cut in the later-described process, and it is therefore not necessary to consider whether it is suitable for cutting. For this reason, the sealing layer 131 may be made of a material having moisture barrier properties that are superior to those of the sealing layer 130. For example, the sealing layer 131 may be made of epoxy resin, which has moisture barrier properties that are superior to those of acrylic resin.

Generally, in the case of making the sealing layer 130 and the sealing layer 131 with different materials, the materials may be selected such that the sealing layer 130 is more suitable for cutting than the sealing layer 131, and that the sealing layer 131 has moisture barrier properties that are superior to those of the sealing layer 130. One example of such a combination other than the aforementioned example may be the sealing layer 130 made of silicon resin and the sealing layer 131 made of epoxy resin, for example.

Subsequently, the areas other than the area enclosed by the sealing layers 130 and 131 (that is, the pixel array 102 portion) are covered with a mask, and the scintillator layer 120 is formed by vacuum deposition or the like. The scintillator layer 120 is formed by a set of crystals having a columnar structure that have been grown by vapor-depositing cesium iodide (CsI), sodium iodide (NaI), or the like, for example. As a dopant (activator) for vapor-deposition, thallium (Tl), Sodium (Na), or the like may be used. The material of the mask for covering the upper face of the sealing layers 130 and 131 and the portion of the covering layer 110 outward of the sealing layers 130 and 131 may be a tape, a metallic mask, a glass mask, a ceramic mask, a rubber-sheet mask, or the like. In the case of using a tape, polyimide tape may be used, which has superior heat resistance properties, and in the case of using a rubber sheet, fluororubber may be used. The scintillator layer 120 may be grown such that its height (i.e., the distance from the covering layer 110) is equal to the height (i.e., the distance from the covering layer 110) of the sealing layers 130 and 131. Sealing properties achieved by the protection layers 140 and 141 improve by the height of the scintillator layer 120 being set to be the same as that of the sealing layers 130 and 131. In another embodiment of the present invention, the scintillator layer 120 may have a different height from that of the sealing layers 130 and 131.

Subsequently, the protection layers 140 and 141 are bonded to the upper face of the scintillator layer 120 and the upper face of the sealing layers 130 and 131. At this time, a sheet obtained by bonding the protection layer 140 to the protection layer 141 may be bonded to the scintillator layer 120 and the sealing layers 130 and 131. Instead, the protection layer 140 may be bonded to the scintillator layer 120 and the sealing layers 130 and 131, and then the protection layer 141 may be further bonded thereto. The protection layer 140 functions as a moisture-proof protection layer and adhesive layer for the scintillator layer 120, and may be made of hot-melt resin (HM), polyethylene terephthalate (PET), polyimide (PI), or the like, for example. Among these materials, hot-melt resin, which has superior moisture barrier properties, may be used to form the protection layer 140. Hot-melt resin refers to adhesive resin that does not contain water or solvent, is solid at room temperature, and is made of 100% nonvolatile thermoplastic material. Hot-melt resin melts when the resin temperature rises, and is solidified when the resin temperature decreases. Also, hot-melt resin is adhesive to other organic material and inorganic material when in a heated and molten state, and is not adhesive in a solid state when at room temperature. Also, since hot-melt resin does not contain polar solvents, solvents, or water, it does not melt the scintillator layer, which is deliquescent (e.g., a scintillator layer having a columnar crystal structure made of alkali halide), even when coming in contact with the scintillator layer. The protection layer 141 functions as a moisture-proof protection layer and reflecting layer for the scintillator layer 120, and is a metallic layer that is made of aluminum (AL) or the like, or is a metal/resin laminated structure that is made of Al/PET, Al/PI, or the like, for example. Although two protection layers 140 and 141 are formed in the present embodiment, the protection layer may be a monolayer. Generally, the protection layer may be made of any kind of material and may have any kind of structure, as long as it can cover the upper face of the scintillator layer 120 and has moisture barrier properties.

Figure 1B:
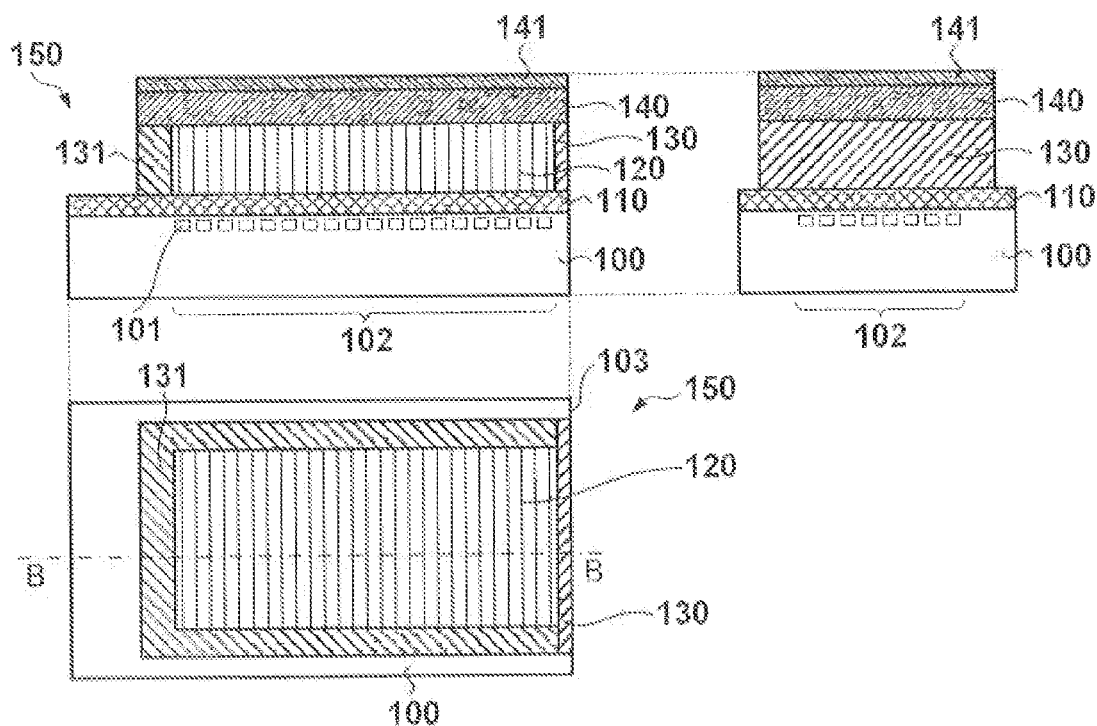

Subsequently, as shown in FIG. 1B, the structure shown in FIG. 1A is cut, using the scribe line 103 as a mark, to manufacture a radiation detection apparatus 150. In FIG. 1B, the lower diagram is a plan view of the radiation detection apparatus 150, the upper right diagram is a right-side view of the radiation detection apparatus 150, and the upper left diagram is a cross-sectional view of the radiation detection apparatus 150, taken along line B-B. The plan view shows the sensor substrate 100, the scintillator layer 120, and the sealing layers 130 and 131, and omits the other components, for the purpose of explanation. Since the covering layer 110, the sealing layer 130, and the protection layers 140 and 141 are formed on the scribe line 103, the covering layer 110, the sealing layer 130, and the protection layers 140 and 141 are also cut together by cutting the sensor substrate 100 using the scribe line 103 as a mark. Cutting may be performed by means of a diamond saw, dicing, a carbon dioxide laser, or the like. As a result, the cut surface of the sensor substrate 100, the cut surface of the covering layer 110, the cut surface of the sealing layer 130, and the cut surface of the protection layers 140 and 141 are located on the same plane.

In the radiation detection apparatus 150 obtained by the above-described manufacturing method, the sealing layers and the protection layers are not formed on the side face of the sensor substrate 100 on one side of the radiation detection apparatus 150, and it is therefore possible to shorten the distance from the pixel array 102 to the edge of the radiation detection apparatus 150. In the present embodiment, the edge of the radiation detection apparatus 150 coincides with the scribe line 103 on this narrow bezel side. Also, since the sensor substrate 100, the covering layer 110, the sealing layer 130, the protection layers 140 and 141 are collectively cut, the manufacturing process is simplified. Further, since the scintillator layer 120 is covered with the sealing layers 130 and 131 and the protection layers 140 and 141, which have moisture barrier properties, it does not impair moisture barrier properties of the radiation detection apparatus 150. Also, since a sealing layer or a protection layer is not formed on the back face of the sensor substrate 100, a protection layer does not cause artifacts even if the radiation detection apparatus 150 is a radiation detection apparatus of so-called back-side illumination type, which is a radiation detection apparatus that radiation enters from the back side of the sensor substrate 100.

Although only one of four sides of the radiation detection apparatus 150 is a narrow bezel side in the above-described embodiment, multiple sides may be formed as narrow bezel sides by applying the above-described method thereto in another embodiment. For example, two opposite sides of the radiation detection apparatus may be narrow bezel sides, or two adjoining sides may be narrow bezel sides. Alternatively, three sides of the radiation detection apparatus may be narrow bezel sides, or all four sides may be narrow bezel sides. In this case, the sealing layer 130 may be arranged on the narrow bezel sides, and the sealing layer 131 may be arranged on the other sides.

Also, in the above-described embodiment, all four side faces of the scintillator layer 120 are covered with the sealing layers 130 and 131. However, in another embodiment, the side face(s) of the scintillator layer 120 may be covered with the sealing layer on one or more sides including a narrow bezel side, and the other side face(s) of the scintillator layer 120 may be covered with the protection layers 140 and 141 or other moisture-proof sheet.

Next, different variations of the manufacturing method of the above-described first embodiment will be described using FIGS. 2A to 2F. These variations can be combined as appropriate. FIG. 2A is a plan view of a radiation detection apparatus 210 of a first variation. The radiation detection apparatus 210 is similar to the radiation detection apparatus 150, except that the radiation detection apparatus 210 includes an electric component 211. The electric component 211 is a component for outputting a signal obtained by the pixels 101 to the outside, and is constituted by a flexible cable having an IC, for example. The electric component 211 is arranged on a side other than a narrow bezel side. Although it is arranged on the side opposite to the narrow bezel side in the example of FIG. 2A, it may be arranged on a side adjacent to the narrow bezel side. Also, it may be arranged only on one or two of the three sides other than the narrow bezel side, or all of these three sides. The electric component 211 may be formed on the sensor substrate 100 before the scintillator layer 120, the sealing layers 130 and 131, and the protection layers 140 and 141 are formed, or may be formed on the sensor substrate 100 after they are formed. Also, the electric component 211 may be formed before the sensor substrate 100 and the like are cut, or may be formed after they are cut.

FIG. 2B is a cross-sectional view of a radiation detection apparatus 220 of a second variation. The radiation detection apparatus 220 is similar to the radiation detection apparatus 150, except that the sensor substrate 100 includes a tapered portion 221. The tapered portion 221 is formed by removing a portion including the side formed by the cut surface and the back face (the face opposite to the face on which the scintillator layer 120 is formed) among the sides of the sensor substrate 100 of the radiation detection apparatus 150 shown in FIG. 1B. The angle of the tapered portion 221 may be 45 degrees, in consideration of the ease of manufacturing. The chamfer dimension of the tapered portion 221 may be smaller than or equal to C1. The chamfer dimension may be larger than or equal to C0.3, for example C0.5, if the sensor substrate 100 is made of glass.

As a result of the sensor substrate 100 having the tapered portion 221, cracks or the like are removed from the sensor substrate 100, mechanical strength of the sensor substrate 100 increases, and durability of the radiation detection apparatus 220 improves. Also, in the case where the radiation detection apparatus 220 is a radiation detection apparatus of the back-side illumination type, artifacts near the cut surface can be reduced as a result of the sensor substrate 100 having the tapered portion 221. The tapered portion 221 may be formed only on the narrow bezel side as shown in FIG. 2B, or the tapered portion 221 may be additionally formed on other sides of the sensor substrate 100.

FIG. 2C is a cross-sectional view of a radiation detection apparatus 230 of a third variation. The radiation detection apparatus 230 is similar to the radiation detection apparatus 220, except that the sensor substrate 100 of the radiation detection apparatus 230 has polished portions 231 in place of the tapered portion 221. Each polished portion 231 is formed by polishing and grinding a portion including the side formed by the cut surface and the back face (the face opposite to the face on which the scintillator layer 120 is formed) among the sides of the sensor substrate 100 of the radiation detection apparatus 150 shown in FIG. 1B.

The radiation detection apparatuses 220 and 230 are similar in that the thickness of the sensor substrate 100 becomes thinner from the center of the sensor substrate 100 towards its side faces. As a result of having this shape, it is possible to maintain mechanical strength, reduce light scattering at the edge of the sensor substrate 100, and improve the MTF of the pixels 101 in the pixel array 102 that are located at positions near the edge, compared with the case where the entire sensor substrate 100 is uniformly thinned. In particular, the MTF of the pixels 101 can be improved on the narrow bezel side, which is effective when the radiation detection apparatuses 220 and 230 are used in mammography.

FIG. 2D is a cross-sectional view of a radiation detection apparatus 240 of a fourth variation. The radiation detection apparatus 240 is similar to the radiation detection apparatus 150, except that the radiation detection apparatus 240 has heat-sealed portions 241 in the protection layers 140 and 141. The heat-sealed portions 241 are portions that are thinner than other parts of the protection layers 140 and 141 as a result of heat-sealing the protection layers 140 and 141 from above. The heat-sealed portions 241 may be formed on the sealing layers 130 and 131, or may be formed over the sealing layers 130 and 131 and the scintillator layer 120. As a result of forming the heat-sealed portions 241, moisture barrier properties of the scintillator layer 120 improve. The heat-sealed portions 241 may be formed before the cutting process of the first embodiment, or may be formed after the cutting process. If the heat-sealed portions 241 are formed before the cutting process, moisture barrier properties of the scintillator layer 120 during the cutting process can be improved. The heat-sealed portion 241 may be formed only in a portion that covers the sealing layer 130 whose width is thinned due to cutting, or may have a closed linear shape that surrounds the scintillator layer 120.

FIG. 2E is a cross-sectional view of a radiation detection apparatus 250 of a fifth variation. The radiation detection apparatus 250 is similar to the radiation detection apparatus 240, except that the radiation detection apparatus 250 has heat-sealed portions 251 in place of the heat-sealed portions 241. The heat-sealed portions 251 may be formed similarly to the heat-sealed portions 241, but are formed at positions where the cut surface of the sealing layer 130 is covered. One of such heat-sealed portions 251 is formed, for example before the cutting process, by forming the heat-sealed portion 251 on the protection layers 140 and 141 at positions where the scribe line 103 is covered. The heat-sealed portion 251 that is thus formed is cut together with the sensor substrate 100 and so on in the cutting process. As a result, the cut surface of the heat-sealed portion 251 is also located on the same plane as the cut surfaces of the sensor substrate 100 and so on.

FIG. 2F shows an enlarged cross-sectional view of a portion around the sealing layer 130 in a radiation detection apparatus 260 of a sixth variation. The scintillator layer 120 is formed after the sealing layers 130 and 131 are formed in the first embodiment, while, in contrast, the sealing layers 130 and 131 are formed after the scintillator layer 120 is formed in the sixth variation. In the sixth variation, the scintillator layer 120 may be formed with a set of column crystals 121, and the sealing layers 130 and 131 may be made of resin having flow properties before curing. In this case, a part of resin for forming the sealing layer 130 enters between columns of the column crystals 121. As a result, moisture barrier properties of the scintillator layer 120 further improve.

A method of manufacturing a radiation detection apparatus according to a second embodiment of the present invention will be described with reference of FIG. 3. The components that are similar to those of the first embodiment will be given the same reference signs, and redundant descriptions thereof will be omitted. Also, variations of the first embodiment are similarly applicable to the second embodiment. First, a structure having a sensor substrate 100, on which a covering layer 110, scintillator layers 120a and 120b, sealing layers 330, 331a, and 331b, and protection layers 140 and 141 are formed, is prepared. In FIG. 3, the lower diagram is a plan view of this structure, the upper right diagram is a right-side view of the structure, and the upper left diagram is a cross-sectional view of the structure, taken along line C-C. The plan view shows the sensor substrate 100, the scintillator layers 120a and 120b, and the sealing layers 330, 331a, and 331b, and omits the other components, for the purpose of explanation.

On the sensor substrate 100, two pixel arrays, namely a pixel array 102a (first pixel array) and a pixel array 102b (second pixel array) are formed, in each of which a plurality of pixels 101 are arranged in an array. The pixel arrays 102a and 102b may have a configuration that is similar to that of the pixel array 102 described in the first embodiment, and redundant descriptions thereof will be omitted. The pixel array 102a and the pixel array 102b are adjacent to each other, and are formed such that an interval therebetween is 4 mm or smaller, for example. A side of the pixel array 102a faces a side of the pixel array 102b. In the present embodiment, a scribe line 303 is formed between the pixel array 102a and the pixel array 102b.

Subsequently, as in the first embodiment, the covering layer 110 is formed, and the sealing layers 330, 331a, and 331b are formed on the covering layer 110. The sealing layer 330 may be made of a material that is similar to that of the sealing layer 130 of the first embodiment, and the sealing layers 331a and 331b may be made of a material that is similar to that of the sealing layer 131 of the first embodiment. The sealing layer 330 is formed at a position where an area between the pixel array 102a and the pixel array 102b is covered. The sealing layer 331a is formed around the remaining three sides of the pixel array 102a. The sealing layer 331b is formed around the remaining three sides of the pixel array 102b.

Subsequently, similarly to the scintillator layer 120 of the first embodiment, the scintillator layer 120a (first scintillator layer) that covers the pixel array 102a and the scintillator layer 120b (second scintillator layer) that covers the pixel array 102b are formed. The scintillator layer 120a and the scintillator layer 120b may be formed in the same vapor-deposition process. One side face of the scintillator layer 120a that is thus formed (i.e., the side face that faces the scintillator layer 120b) is covered with the sealing layer 330, and the remaining side faces of the scintillator layer 120a are covered with the sealing layer 331a. Also, one side face of the scintillator layer 120b that is thus formed (i.e., the side face that faces the scintillator layer 120a) is covered with the sealing layer 330, and the remaining side faces of the scintillator layer 120b are covered with the sealing layer 331b.

Subsequently, as in the first embodiment, the protection layers 140 and 141 are formed. Thereafter, the sensor substrate 100 is cut using the scribe line 303 as a mark as in the first embodiment, and thereby, the covering layer 110, the sealing layer 330, and the protection layers 140 and 141 are also cut together. In the present embodiment, two radiation detection apparatuses 150, each shown in FIG. 1B, can be formed at a time by performing a single vapor-deposition process and a single cutting process. As a result, the number of processes and the manufacturing costs can be reduced.

Figure 4:
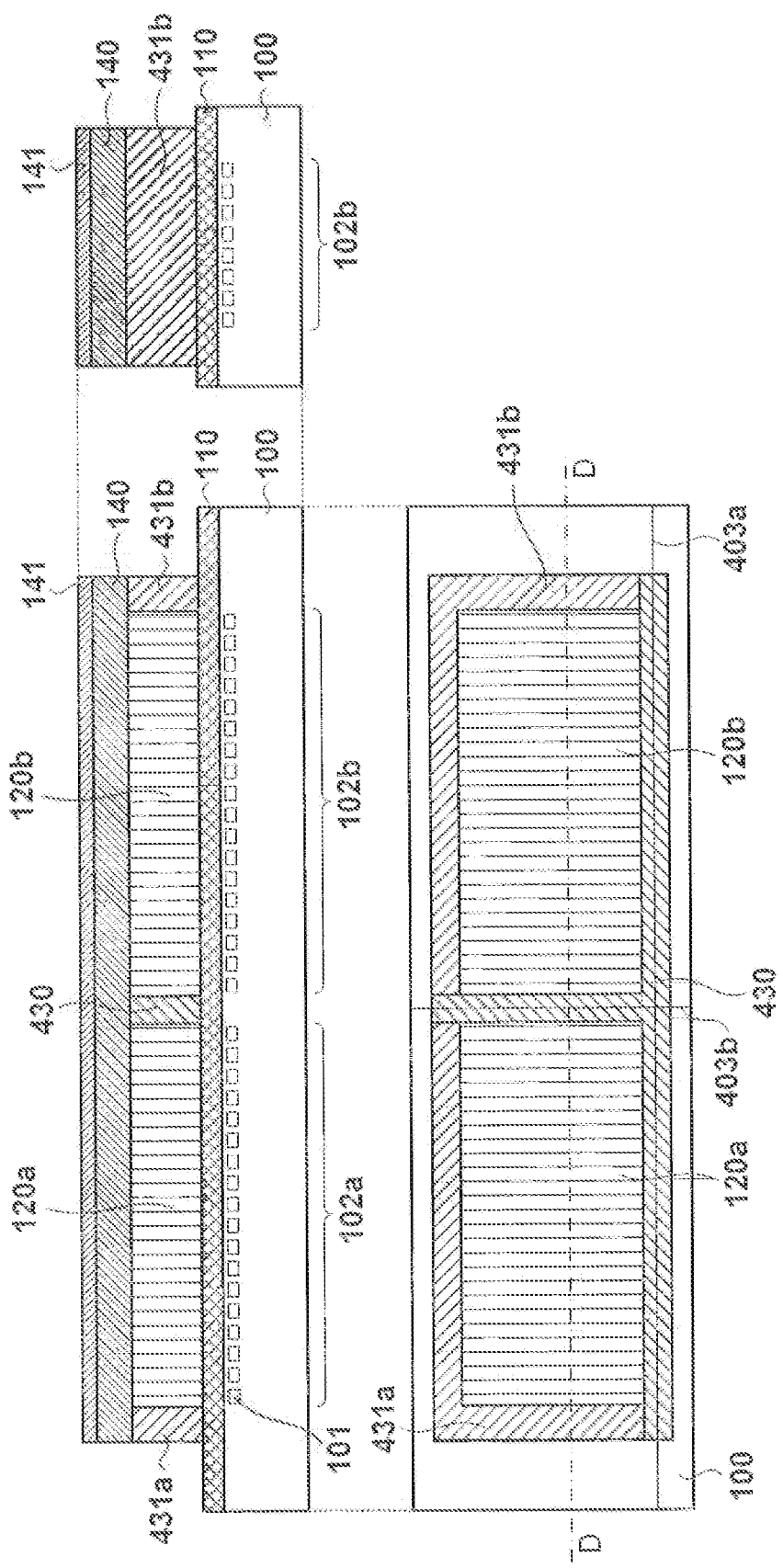
FIG. 4 is a diagram showing an exemplary method of manufacturing a radiation detection apparatus of some embodiments of the present invention.

A method of manufacturing a radiation detection apparatus according to a third embodiment of the present invention will be described using FIG. 4. The components that are similar to those of the first embodiment will be given the same reference signs, and redundant descriptions thereof will be omitted. Also, variations of the first embodiment are similarly applicable to the third embodiment. First, a structure having a sensor substrate 100, on which a covering layer 110, scintillator layers 120a and 120b, sealing layers 430, 431a, and 431b, and protection layers 140 and 141 are formed, is prepared. In FIG. 4, the lower diagram is a plan view of this structure, the upper right diagram is a right-side view of the structure, and the upper left diagram is a cross-sectional view of the structure, taken along line D-D. The plan view shows the sensor substrate 100, the scintillator layers 120a and 120b, and the sealing layers 430, 431a, and 431b, and omits the other components, for the purpose of explanation.

On the sensor substrate 100, two pixel arrays, namely a pixel array 102a (first pixel array) and a pixel array 102b (second pixel array) are formed, in each of which a plurality of pixels 101 are arranged in an array. The pixel arrays 102a and 102b may have a configuration that is similar to that of the pixel array 102 described in the first embodiment, and redundant descriptions thereof will be omitted. The pixel array 102a and the pixel array 102b are adjacent to each other, and are formed such that an interval therebetween is 4 mm or smaller, for example. A side of the pixel array 102a faces a side of the pixel array 102b. In the present embodiment, a scribe line 403a is formed along one of the sides of the pixel array 102a that is adjacent to the side thereof facing the pixel array 102b, and a scribe line 403b is formed between the pixel array 102a and the pixel array 102b. The scribe line 403a is also along a side of the pixel array 102b.

Subsequently, as in the first embodiment, the covering layer 110 is formed, and the sealing layers 430, 431a, and 431b are formed on the covering layer 110. The sealing layer 430 may be made of a material that is similar to that of the sealing layer 130 of the first embodiment, and the sealing layers 431a and 431b may be made of a material that is similar to that of the sealing layer 131 of the first embodiment. The sealing layer 430 is formed at a position where an area between the pixel array 102a and the pixel array 102b is covered, and around one side of each of the pixel arrays 102a and 102b that is adjacent to this area. The sealing layer 431a is formed around the remaining two sides of the pixel array 102a. The sealing layer 431b is formed around the remaining two sides of the pixel array 102b.

Subsequently, the scintillator layer 120a (first scintillator layer) that covers the pixel array 102a and the scintillator layer 120b (second scintillator layer) that covers the pixel array 102b are formed in a manner similar to the scintillator layer 120 of the first embodiment. The scintillator layer 120a and the scintillator layer 120b may be formed in the same vapor-deposition process. Two adjacent side faces of the scintillator layer 120a that is thus formed (i.e., the side face that faces the scintillator layer 120b, and the side face that is adjacent thereto) are covered with the sealing layer 430, and the remaining side faces of the scintillator layer 120a are covered with the sealing layer 431a. Also, two side faces of the scintillator layer 120b that is thus formed (the side face that faces the scintillator layer 120a and the side face that is adjacent thereto) are covered with the sealing layer 430, and the remaining side faces of the scintillator layer 120b are covered with the sealing layer 431b.

Subsequently, as in the first embodiment, the protection layers 140 and 141 are formed. Thereafter, the sensor substrate 100 is cut using the scribe line 403a as a mark, then the sensor substrate 100 is cut using the scribe line 403b as a mark, and thereby, the covering layer 110, the sealing layer 330, and the protection layers 140 and 141 are also cut together. The respective cutting processes may be performed similarly to the cutting process of the first embodiment. In the present embodiment, two radiation detection apparatuses having two narrow bezel sides can be formed at a time by performing a single vapor-deposition process and two cutting processes. As a result, the number of processes and the manufacturing costs can be reduced.

Here, a scribe line 403c is prepared on the side that faces the side on which the scribe line 403a is provided across the scintillator layer 120b. The sensor substrate 100 may be cut using the scribe line 403a as a mark on one hand, while the sensor substrate 100 may be cut using the scribe line 403c as a mark on the other hand. It is thereby possible not only to reduce the number of processes and the manufacturing cost, but also to manufacture identical radiation detection apparatuses having two narrow bezel sides. Furthermore, identical radiation detection apparatuses having three narrow bezel sides can be manufactured by cutting the scribe lines 403a, 403b, and 403c.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-150751, filed Jul. 4, 2012, which is hereby incorporated by reference herein in its entirety.

What is claimed is:

1. A method of manufacturing a radiation detection apparatus, comprising:
    forming, on a sensor substrate on which a pixel array is formed, a scintillator layer that covers the pixel array, a sealing layer that covers a side face of the scintillator layer, and a protection layer that covers an upper face of the scintillator layer and an upper face of the sealing layer; and
    cutting the sensor substrate, the sealing layer, and the protection layer along a side of the pixel array such that a cut surface of the sensor substrate, a cut surface of the sealing layer, and a cut surface of the protection layer are arranged on the same plane.

2. The method according to claim 1,
    wherein the sealing layer includes a first portion that covers one or more side faces of the scintillator layer, and a second portion that covers other one or more side faces of the scintillator layer, and
    during the cutting, the first portion of the sealing layer is cut.

3. The method according to claim 2,
    wherein the second portion of the sealing layer is made of a material having moisture barrier properties that are superior to those of the first portion of the sealing layer.

4. The method according to claim 1, further comprising:
    heat-sealing the protection layer toward the sealing layer to form a heat-sealed portion in the protection layer.

5. The method according to claim 4,
    wherein during the cutting, the protection layer is cut in the heat-sealed portion.

6. The method according to claim 1,
    wherein the forming includes forming a scribe line on the sensor substrate along a side of the pixel array,
    the sealing layer is formed on the scribe line, and
    the cutting is performed using the scribe line.

7. The method according to claim 1,
    wherein the forming includes forming the sealing layer using resin after the scintillator layer is formed using a set of column crystals, and
    the resin for forming the sealing layer enters between columns of the set of the column crystals.

8. The method according to claim 1, further comprising:
    removing a part of a back face of the sensor substrate such that the thickness of the sensor substrate becomes thinner toward the cut surface of the sensor substrate.

9. The method according to claim 1,
wherein during the forming, a first pixel array and a second pixel array that are adjacent to each other are each formed as the pixel array on the sensor substrate, and one side of the first pixel array faces one side of the second pixel array, the scintillator layer includes a first scintillator layer that covers the first pixel array and a second scintillator layer that covers the second pixel array, the sealing layer covers a side face of the first scintillator layer and a side face of the second scintillator layer, the protection layer covers an upper face of the first scintillator layer, an upper face of the second scintillator layer, and an upper face of the sealing layer, and during the cutting, the sensor substrate, the sealing layer, and the protection layer are cut at a position between the first pixel array and the second pixel array.

10. The method according to claim 9, further comprising:
before the cutting, cutting the sensor substrate, the sealing layer, and the protection layer along a side of the first pixel array that is adjacent to a side thereof facing the second pixel array.

11. A radiation detection apparatus comprising:
a sensor substrate having a pixel array;
a scintillator layer that covers the pixel array;
a sealing layer that covers a side face of the scintillator layer; and
a protection layer that covers an upper face of the scintillator layer and an upper face of the sealing layer,
wherein at least one side face of the sensor substrate is located on the same plane as a side face of the sealing layer and a side face of the protection layer.

* * * * *